(12) United States Patent
Riou

(10) Patent No.: US 10,420,218 B2
(45) Date of Patent: Sep. 17, 2019

(54) COMPACT ELECTRONIC SYSTEM AND DEVICE COMPRISING SUCH A SYSTEM

(71) Applicant: SAFRAN ELECTRONICS & DEFENSE, Boulogne Billancourt (FR)

(72) Inventor: Jean-Christophe Riou, Boulogne Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 15/759,062

(22) PCT Filed: Sep. 15, 2016

(86) PCT No.: PCT/EP2016/071869
§ 371 (c)(1),
(2) Date: Mar. 9, 2018

(87) PCT Pub. No.: WO2017/046269
PCT Pub. Date: Mar. 23, 2017

(65) Prior Publication Data
US 2019/0008047 A1    Jan. 3, 2019

(30) Foreign Application Priority Data
Sep. 15, 2015    (FR) ..................... 15 58630

(51) Int. Cl.
*H05K 1/18*    (2006.01)
*H05K 1/11*    (2006.01)
*H05K 5/00*    (2006.01)
*H05K 5/06*    (2006.01)

(52) U.S. Cl.
CPC ............... *H05K 1/181* (2013.01); *H05K 1/11* (2013.01); *H05K 5/0021* (2013.01); *H05K 5/0047* (2013.01); *H05K 5/06* (2013.01); *H05K 2201/0999* (2013.01); *H05K 2201/10378* (2013.01)

(58) Field of Classification Search
None
See application file for complete search history.

(56) References Cited

U.S. PATENT DOCUMENTS

| 4,841,355 | A | * | 6/1989 | Parks | ............... | H01L 25/105 |
| | | | | | | 257/686 |
| 5,043,794 | A | * | 8/1991 | Tai | .................. | H01L 23/13 |
| | | | | | | 257/686 |
| 7,613,010 | B2 | * | 11/2009 | Ono | ................. | H01L 23/5385 |
| | | | | | | 361/784 |

(Continued)

FOREIGN PATENT DOCUMENTS

| DE | 43 40 280 A1 | 3/1995 |
| EP | 0 657 121 A1 | 6/1995 |

(Continued)

*Primary Examiner* — Dimary S Lopez Cruz
(74) *Attorney, Agent, or Firm* — Muncy, Geissler, Olds & Lowe, P.C.

(57) ABSTRACT

An electronic system including at least one component, two identical packages including a bottom from which a peripheral rim protrudes defining a recess, and electrical conductors passing through each package, the packages being attached to one another by the rim thereof so as to define a sealed cavity therebetween. An electronic device including two systems of this type superimposed on one another.

12 Claims, 4 Drawing Sheets

(56) References Cited

U.S. PATENT DOCUMENTS

| | | | | |
|---|---|---|---|---|
| 7,781,877 B2* | 8/2010 | Jiang | ............... | H01L 21/561 |
| | | | | 257/686 |
| 2013/0044431 A1* | 2/2013 | Koeneman | ............ | H01L 23/473 |
| | | | | 361/699 |
| 2014/0347839 A1* | 11/2014 | Shah | ............... | A61B 5/6861 |
| | | | | 361/784 |

FOREIGN PATENT DOCUMENTS

| EP | 0 844 899 A1 | 6/1998 |
|---|---|---|
| EP | 2 019 009 A2 | 1/2009 |
| FR | 2 980 932 A1 | 4/2013 |

\* cited by examiner

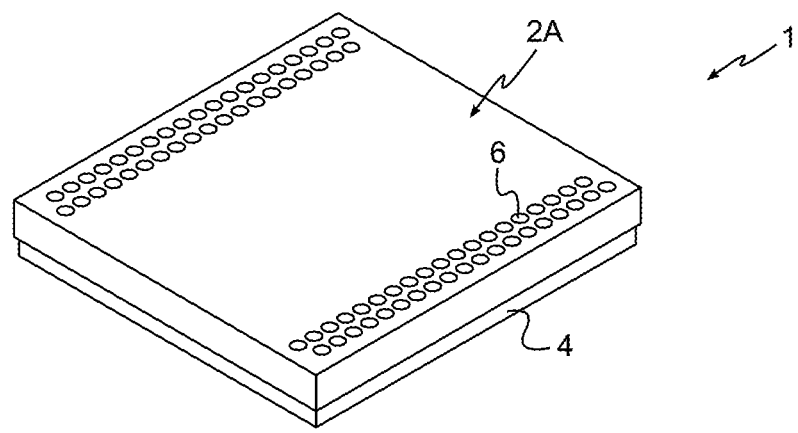
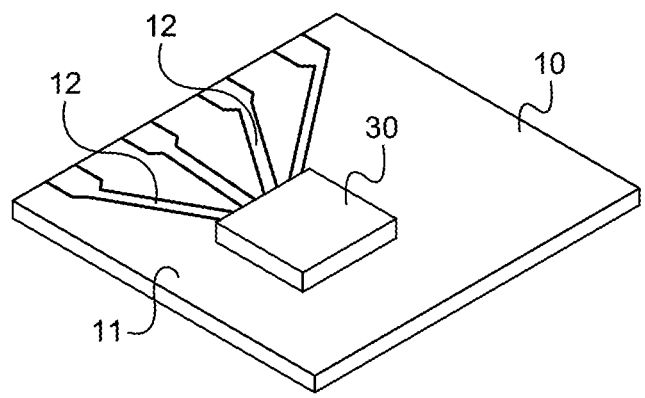
Fig. 1
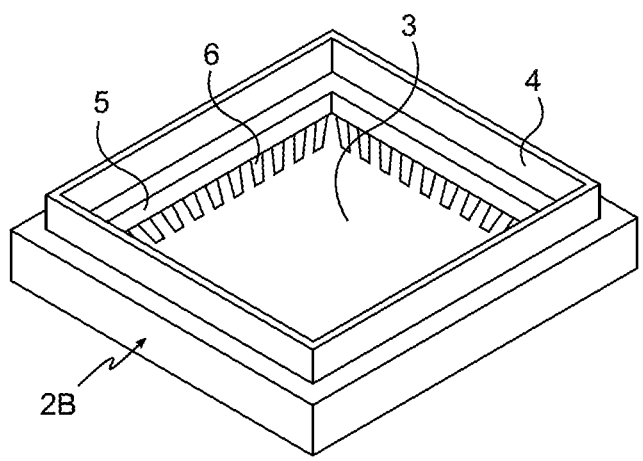

COMPACT ELECTRONIC SYSTEM AND DEVICE COMPRISING SUCH A SYSTEM

The present invention relates to the field of electronic components.

STATE OF THE ART

Surface-mount components (technology conventionally referred to as SMC or SOC) are soldered onto the surface of a printed circuit board (or PCB). The components are generally contained in packages which form mountings for the components and include conductors electrically connecting the components to the printed circuit of the board.

The package normally comprises a bottom, from which a peripheral rim defining a recess for the component protrudes. The bottom has electrical conductors passing through same, which have one end in contact with the conductive pads of the component and an opposing end intended for engaging with the printed circuit. This is commonly referred to as System in Package (SIP).

In certain uses, the component needs to be enclosed in a sealed enclosure defined by an outer shell. The system, i.e. the component in the package thereof, is then arranged entirely within said enclosure, said conductors passing tightly through the shell to connect the system to the printed circuit of the board.

The assembly is thus relatively bulky, and the connections are relatively complicated to make.

SUBJECT OF THE INVENTION

One aim of the invention is to provide an electronic component that is sealed and relatively compact.

BRIEF SUMMARY OF THE INVENTION

For this purpose, the invention relates to the provision of an electronic system comprising at least one component, two identical packages including a bottom from which a peripheral rim defining a recess protrudes, and electrical conductors passing through each package. The packages are attached to one another by the rim thereof in order to define a sealed cavity therebetween.

The invention likewise relates to a device including at least two electronic systems having conductors passing through the bottom of each package, having one end opening onto the bottom of the package outside of same and one end protruding into the recess of the package and connected to the component, the two systems being superimposed and electrically connected to one another by the conductors of the upper package of the lower system and the conductors of the lower package of the upper system.

Other characteristics and advantages of the invention will become apparent upon reading the following description of particular non-restrictive embodiments of the invention.

BRIEF DESCRIPTION OF THE FIGURES

Reference is made to the appended drawings, wherein:

FIG. 1 is an exploded perspective view of a system according to a first embodiment;

DETAILED DESCRIPTION OF THE INVENTION

Figure 2:
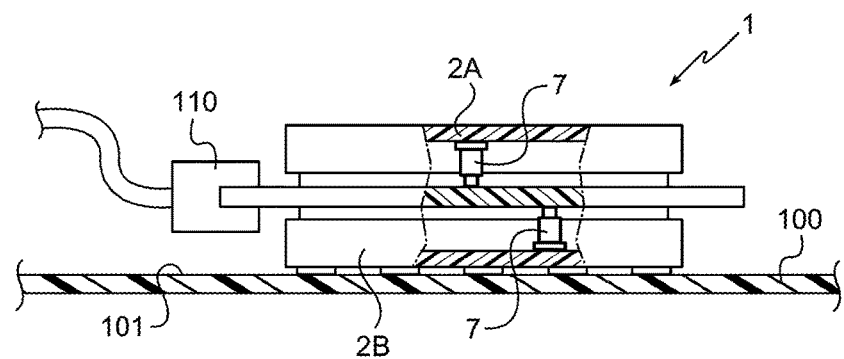
FIG. 2 is a partial cross-section front view of said system.

In reference to the figures, the electronic system according to the invention, generally designated as 1, comprises two identical packages 2 (identified individually in the figures by letters A and B).

Each package 2 includes a bottom 3 from which a peripheral rim 4 defining a recess 5 protrudes. Electrical conductors 6 pass through each package 2. Specifically, the electrical conductors 6 are arranged in an array and pass through the bottom 3 of each package 2, having one end opening into the recess 5 and an opposing end opening onto an outer surface of the bottom 3 opposite the recess 5. Here, the electrical conductors 6 are pins and the packages 2 are CPGA74 packages. Alternatively, the electrical conductors can be balls (BGA packages), columns (CGA packages), or pads (LGA packages).

The packages 2A, 2B are attached to one another by the rim 4 thereof in order to define a sealed cavity therebetween.

In reference specifically to FIGS. 1 and 2 and according to the first embodiment, the system 1 comprises a substrate 10 in the form of a plate extending between the rims 4 of the packages 2, the rims 4 being attached (in this case by soldering) to the substrate 10, allowing the packages 2 to be rigidly connected to one another. The substrate 10 has a peripheral edge 11 which protrudes sidewise from the rims 4 of the packages 2.

The substrate 10 has a surface supporting an electronic component 30 and includes conductive tracks 12 which have contact pads electrically connected to the electronic component 30 and contact pads extending over a portion of the peripheral edge 11 of the substrate 10. The substrate 10 is a double-faced, thick-layer ceramic substrate.

The substrate 10 separates the recesses 5 so that the recess 5 of each package 2 forms a sealed cavity. The electronic component 30 is recessed in one of the sealed cavities. The substrate 10 can support an electronic component 30 on the two surfaces thereof so that each electronic component 30 is recessed in one of the sealed cavities.

As shown in FIG. 2, the system is mounted on a printed circuit board 100 (or PCB) having conductive tracks 101 connected to the electrical conductors 6 (surface-mount or SOC). A connector 110 connected to a device not shown engages with the peripheral edge 11 in order to connect the device to the electronic component 30 via the contact pads of the conductive tracks 12.

Here, piston connectors 7 connect the electrical conductors 6 of the packages 2 to conductive tracks 12 of the substrate 10.

Figure 3:
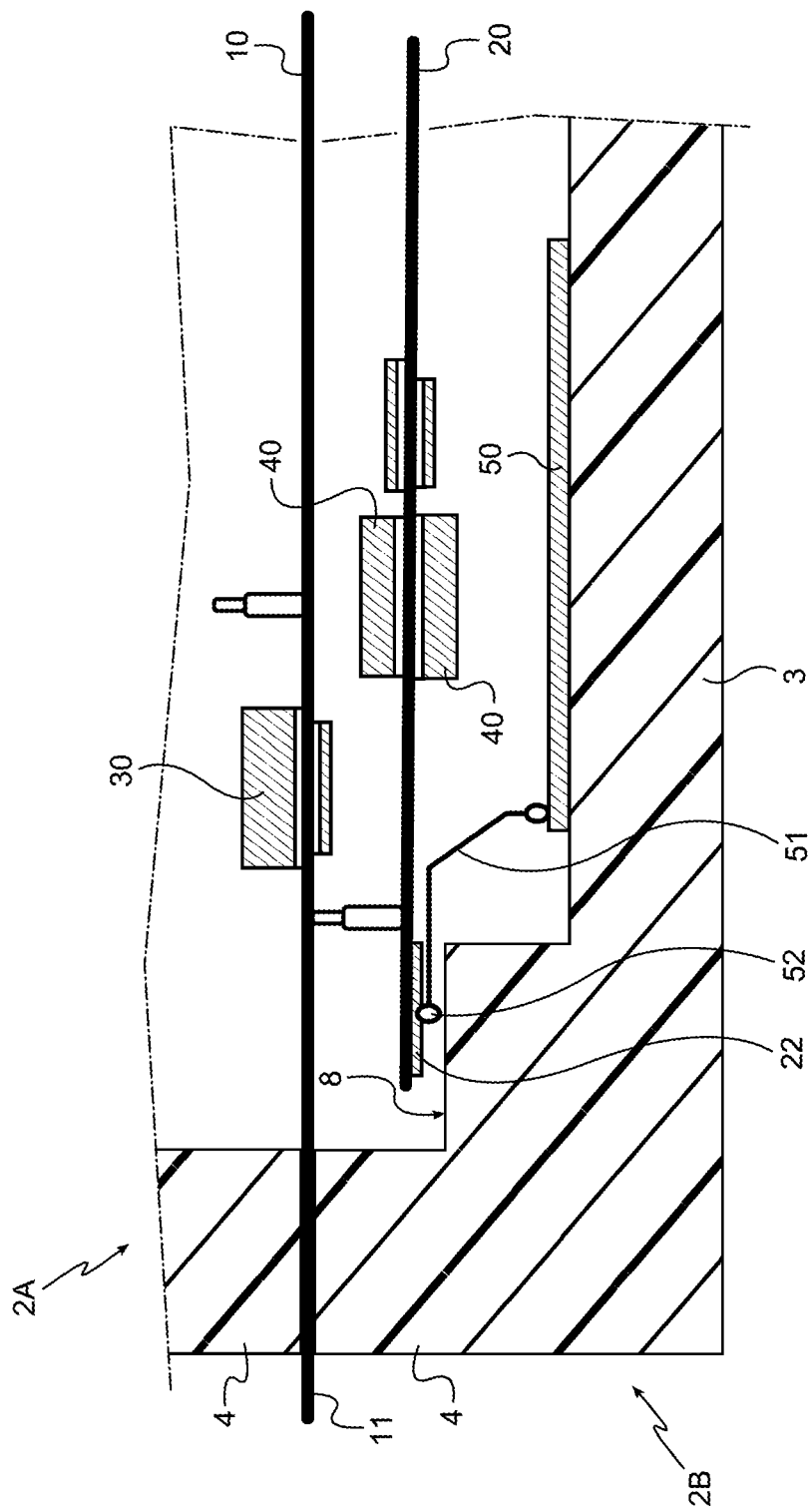
FIG. 3 is a partial cross-section view of a system according to a variant of the first embodiment.

In the variant of FIG. 3, the system comprises a second substrate 20 which has a surface supporting an electronic component 40 and includes conductive tracks 22. The substrate 20 is a thick-layer ceramic substrate.

The substrate 20 is mounted in the recess 5 of the package 2A and has a peripheral rim 21 resting on a shoulder 8 of the rim 4 of the package 2A in order to extend parallel to the substrate 10 and to the bottom 3.

The system 1 comprises first connection means connecting the conductive tracks 22 of the substrate 20 to the electrical conductors 6 of the package 2A, and second means for connecting conductive tracks 22 of the substrate 20 to conductive tracks 12 of the substrate 10. The first connection means comprise conductive tracks 50 extending over the bottom 3 of the package 2A and jumper wires 51 each having one end attached to one of the conductive tracks 50 and an opposing end connected by a ball 52 to one of the tracks 22 in order to connect these conductive tracks 50 to the conductive tracks 22.

The connection means can likewise comprise conductive tracks extending along the rim 4, or inside same, from the bottom 3 in order to connect the conductors 6 to the conductive tracks 22 and/or to the conductive tracks 12.

Figure 4:
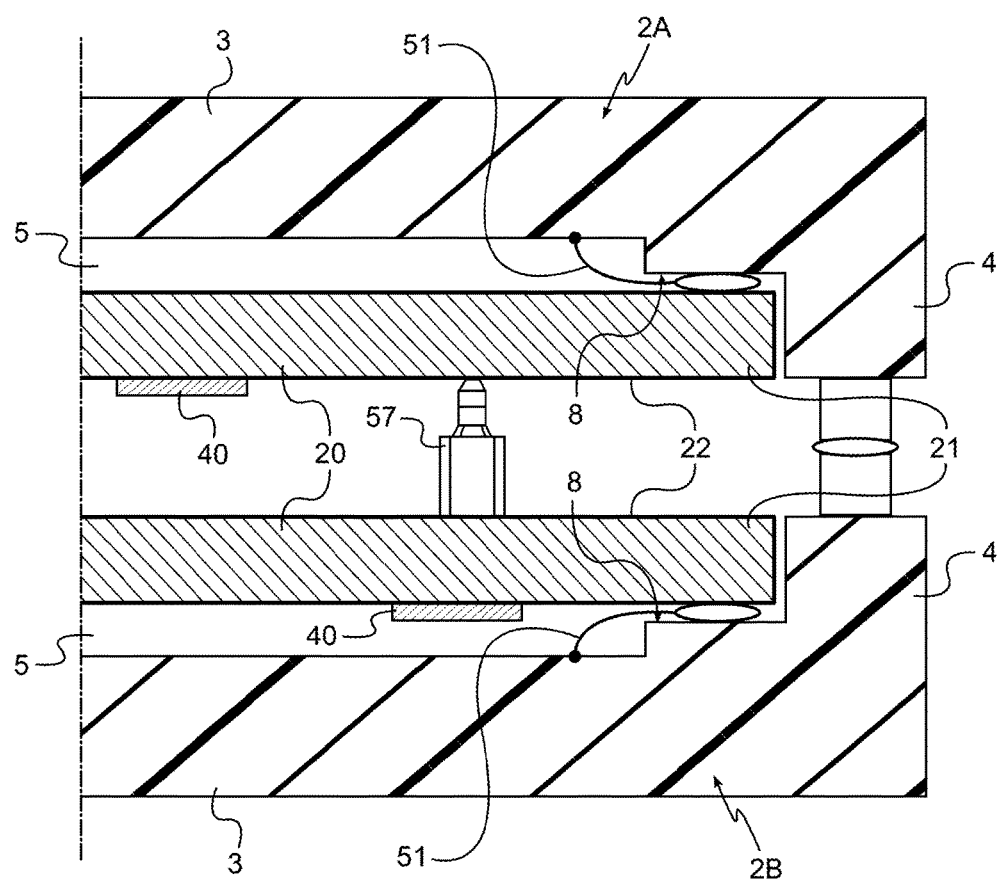
FIG. 4 is a partial cross-section view of a system according to a second embodiment.

In reference specifically to FIG. 4, and according to the second embodiment, the system 1 comprises two packages 2 as above, but does not comprise a central substrate 10. The rims 4 of the packages 2 are directly soldered onto one another.

The system according to the second embodiment comprises two substrates 20 which are each mounted in the recess 5 of one of the packages 2 separated from the bottom 3 of said package 2 and each have a peripheral rim 21 resting on a shoulder 7 of the rim 4 of the package 2 in order to extend parallel to the bottom 3.

Each substrate 20 has an electronic component 40 and is provided with conductive tracks 22 connected to the electronic component 40.

Here, the system comprises first connection means connecting the conductive tracks 22 of each substrate 20 to the electrical conductors 6 of the package 2 to which it is attached, and second means for connecting conductive tracks 22 of one of the substrates 20 to conductive tracks 22 of the other substrate 20.

The first connection means comprise electric wires 51 extending between the electrical conductors 6 and the conductive tracks 22 in question.

The second connection means comprise piston connectors 57 connecting conductive tracks 22 of the substrate 20 of the package 2A to conductive tracks 22 of the substrate 20 of the package 2B.

Figure 5:
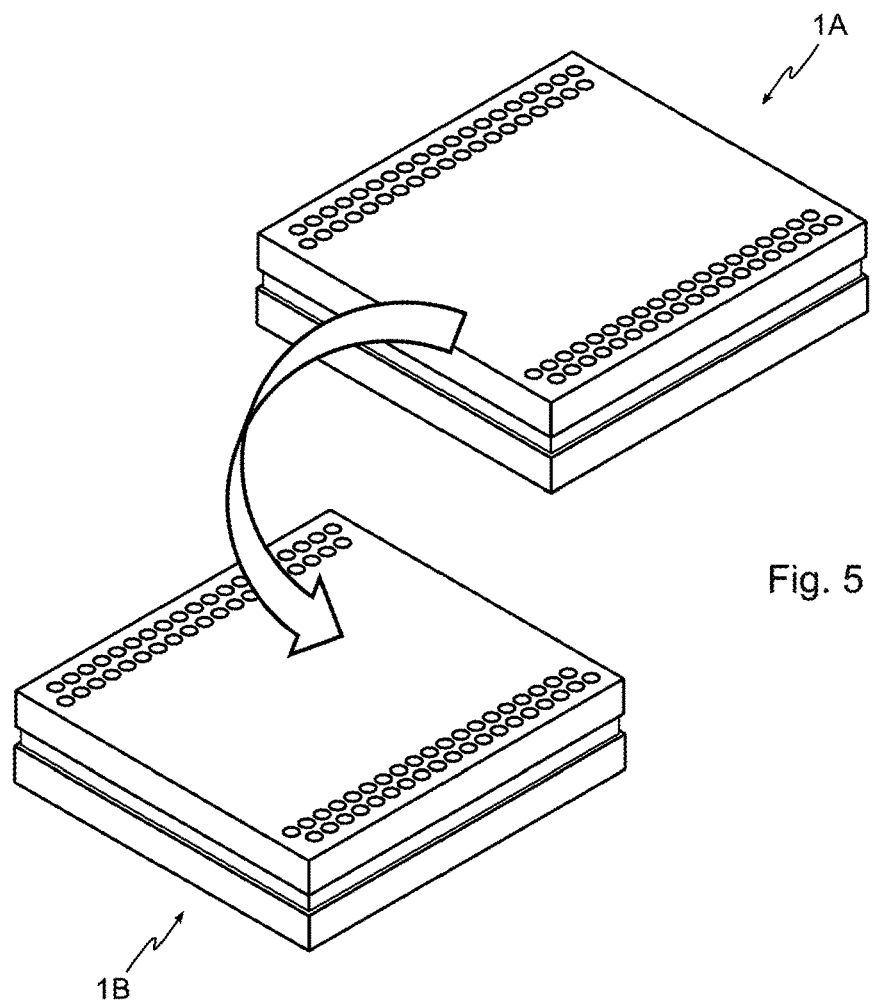
FIG. 5 is an exploded perspective view of a device comprising two systems.
Figure 6:
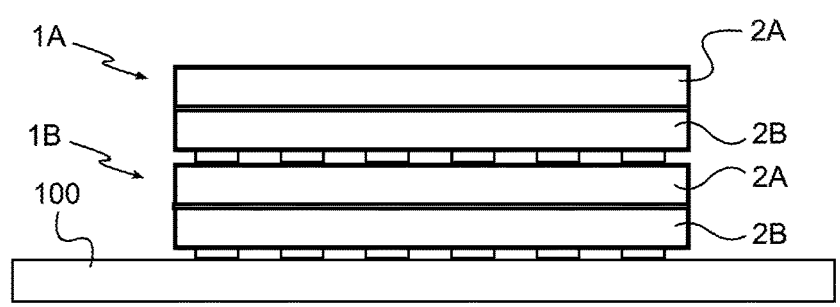
FIG. 6 is a partial cross-section front view of said system.

FIGS. 5 and 6 show an electronic device including two systems 1A, 1B of the preceding type.

The electrical conductors of the package 2B of the system 1B are soldered onto the conductive tracks of a printed circuit board 100. The electrical conductors of the package 2B of the system 1A are soldered onto the electrical conductors of the package 2A of the system 1B so that the systems 1A and 1B are superimposed and electrically connected to one another.

The system 1A includes, for example, a sensor, and the system 1B includes, for example, an electronic circuit for controlling the sensor.

The conductors of the system 1A opening out above the device can, for example, be used to test the operation of the device or to connect an antenna.

The systems can thus be mechanically and electrically superimposed. It is possible to provide for the cavities of the systems to be exposed to identical or different media (gas, liquid or vacuum). This superimposition makes it possible, for example, to extend the electronic function of the device or to offset at least one first function relative to at least one second function.

Of course, the invention is not limited to the described embodiments but encompasses any alternative solution within the scope of the invention as defined in the claims.

In particular, the system can simply comprise a partition separating the recesses 5 so that the recess of each package forms a sealed cavity, the one or more electronic components being recessed in at least one of the sealed cavities.

The system preferably comprises two components, the components being mounted in separate sealed cavities.

Alternatively, the substrate can have a peripheral edge protruding from a single side of the rims 4 of the packages 2.

The substrate is a ceramic or organic substrate.

It is possible to provide a gas absorber in the recess 5.

It should be noted that the recess can receive several electronic functions optionally in connection with the sensors, the whole being arranged mechanically and electrically in the recess so as to allow a transmission of the vertical (3D) and horizontal information between the various levels or substrates.

The invention claimed is:

1. An electronic system comprising at least one electronic component, two identical packages including a bottom from which a peripheral rim defining a recess protrudes, and electrical conductors passing through each of the two identical packages, the two identical packages being attached to one another by the peripheral rim thereof so as to define a sealed cavity receiving a component, the system including at least one first substrate extending between the peripheral rims of the two identical packages, the at least one first substrate supporting the component and including conductive tracks connected to the component.

2. The system according to claim 1, wherein the at least one first substrate has a peripheral edge projecting sidewise from the peripheral rims of the two identical packages, the conductive tracks extending over a portion of the peripheral edge of the at least one first substrate.

3. The system according to claim 2, wherein the at least one first substrate separates the recesses so that the recess of said each of the two identical package forms a sealed cavity, the component being recessed in one of the sealed cavities.

4. The system according to claim 1, comprising at least one second substrate which is mounted between the at least one first substrate and the bottom of one of the two identical packages and which supports a second component, the system including means for electrically connecting conductive tracks of the second substrate to the electrical conductors of said each of the two identical packages and to the conductive tracks of the at least one first substrate.

5. An electronic system comprising at least two electronic components, two identical packages including a bottom from which a peripheral rim defining a recess protrudes, and electrical conductors passing through each of the two identical packages, the two identical packages being attached to one another by the rim thereof so as to define a sealed cavity receiving a component, said electronic system comprising two substrates and the at least two electronic components being mounted each on a one of the two substrates, each of the two substrates being respectively mounted in the recess of each one of the two identical packages at a distance from the bottom of said each of the two identical packages and wherein said each of the two substrates is provided with conductive tracks connected to each component to which it is mounted, first connection means connecting the conductive tracks of said each of the two substrates to the electrical conductors of said each of the two identical packages to which it is attached and second means for connecting the conductive tracks of one of the two substrates to the conductive tracks of the other substrate.

6. The system according to claim 1 or 5, wherein the substrate is a ceramic or organic substrate.

7. The system according to claim 1 or 5, including conductive tracks extending in the recess of at least one of the packages on the bottom of said package and means for electrically connecting said conductive tracks to the component.

8. An electronic device including two systems according to claim 1 or 5, the two systems being superimposed on one another, wherein at least one portion of the electrical conductors of said each of the two packages passes through the bottom of the package having one end opening onto the bottom of the package outside same and one end of the package protruding into the recess of the package and connected to the component, the two systems being electrically connected to one another by the electrical conductors of the one of the packages positioned at the top of the lower system and the electrical conductors of the one of the packages positioned at the bottom of the upper system.

9. An electronic device including two electronic systems, each of the two electronic systems comprising at least one electronic component, two identical packages including a bottom from which a peripheral rim defining a recess protrudes, and electrical conductors passing through each of the two identical package, the two identical packages being attached to one another by the rim thereof so as to define a sealed cavity receiving the at least one electronic component, the two electronic systems being superimposed on one another, wherein at least one portion of the electrical conductors of each of the two identical packages passes through the bottom of the package having one end opening onto the bottom of the package outside same and one end protruding into the recess of the package and connected to the component, the two systems being electrically connected to one another by the electrical conductors of the one of the packages positioned at the top of the lower system and the electrical conductors of the one of the packages positioned at the bottom of the upper system.

10. The electronic device including two electronic systems according to claim 9, the two electronic systems being superimposed on one another, wherein at least one portion of the electrical conductors of each package passes through the bottom of the package having one end opening onto the bottom of the package outside same and one end of the package protruding into the recess of the package and connected to the component, the two systems being electrically connected to one another by the electrical conductors of the one of the packages positioned at the top of the lower system and the electrical conductors of the one of the packages positioned at the bottom of the upper system.

11. The electronic device including two electronic systems according to claim 9, comprising a partition separating the recesses so that the recess of said each of the two packages forms a sealed cavity, the at least one electronic component being recessed in one of the sealed cavities.

12. The system according to claim 11, the at least one electronic component being mounted in separate sealed cavities.

\* \* \* \* \*